United States Patent [19]

Dearnaley

[11] Patent Number: 4,724,300
[45] Date of Patent: Feb. 9, 1988

[54] TEMPERATURE CONTROL IN VACUUM

[75] Inventor: Geoffrey Dearnaley, Abingdon, England

[73] Assignee: United Kingdom Atomic Energy Authority, London, England

[21] Appl. No.: 68,709

[22] Filed: Jun. 30, 1987

Related U.S. Application Data

[63] Continuation of Ser. No. 748,839, Jun. 26, 1985, abandoned.

[30] Foreign Application Priority Data

Jul. 16, 1984 [GB] United Kingdom ............... 8418063

[51] Int. Cl.$^4$ ............................................. B23K 15/00
[52] U.S. Cl. .................... 219/121 EM; 219/121 EB; 250/492.2
[58] Field of Search ............... 219/121 EM, 121 EB, 219/121 LM, 121 L, 121 FS; 250/443.1, 442.2; 148/1.5; 165/61, 86

[56] References Cited

U.S. PATENT DOCUMENTS

| | | | |
|---|---|---|---|
| 3,566,960 | 3/1971 | Stuart | 165/107 |
| 3,818,982 | 6/1974 | Wagner | 165/86 |
| 4,043,836 | 8/1977 | Jun | 148/1.5 |
| 4,155,011 | 5/1979 | Märk | 250/492 A |
| 4,261,762 | 4/1981 | King | 148/1.5 |
| 4,453,080 | 6/1984 | Berkowitz | 250/443.1 |
| 4,569,697 | 2/1986 | Tsu et al. | 148/1.5 |

Primary Examiner—C. L. Albritton
Attorney, Agent, or Firm—William R. Hinds

[57] ABSTRACT

An apparatus 10 and a method are provided for treating silicon wafers 26 in vacuum with an ion beam B and for controlling the temperature of the wafers 26. The wafers 26 are mounted on a drum 22 which is rotated through the ion beam B, and which is large enough that the mean equilibrium temperature of the wafers 26, in the absence of any other energy sources, would be less than the desired temperature. The wafers 26 are additionally heated by infra-red lamps 34 so the desired temperature is achieved.

10 Claims, 1 Drawing Figure

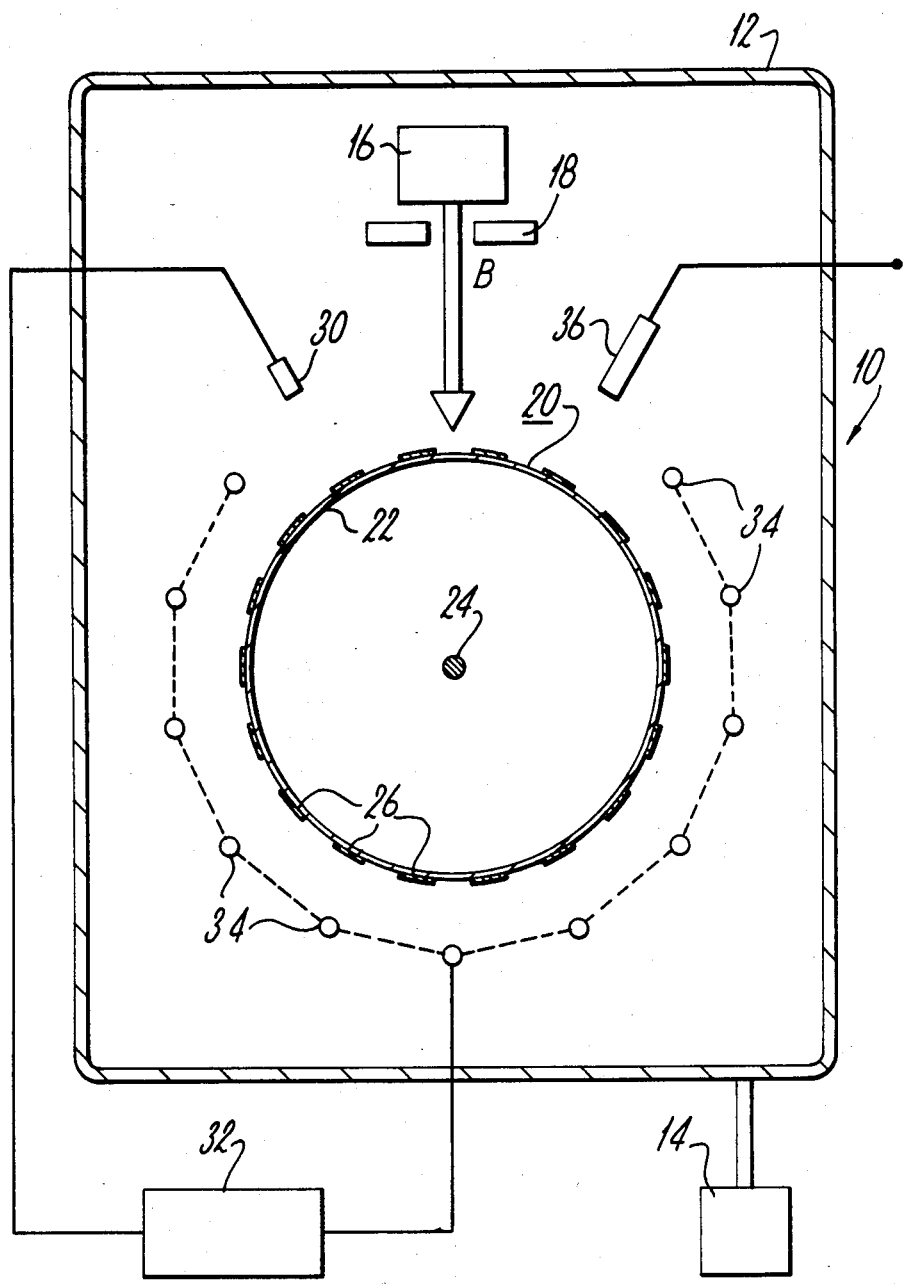

TEMPERATURE CONTROL IN VACUUM

This application is a continuation, of application Ser. No. 748,839, filed 06/26/85 (now abandoned).

This invention relates to a method and an apparatus for treating a plurality of samples, such as silicon wafers, in vacuum, and in particular for controlling the temperature of the samples during such treatment.

During ion beam treatment of silicon wafers, for example, the beam power is dissipated as heat in the wafers. Various methods are known for controlling temperatures of silicon wafers during ion beam treatment by improving the rate at which heat is lost by the wafers. U.S. Pat. No. 3,818,982 describes a system in which an elastic membrane is inflated into thermal contact with the rear of the wafers by a coolant fluid supplied to the other side of the membrane, so improving heat transfer by conduction. U.S. Pat. No. 4,261,762 describes a system in which a low pressure gas is provided between the rear of each wafer and a support system. This minimises the chance of impurities being transferred to the wafer, but is complex to apply to the treatment of large numbers of wafers. It is also known to support wafers during ion beam treatment inside a rotating drum, for example as shown in U.S. Pat. No. 4,155,011, so that centrifugal forces urge the wafers into good thermal contact with the drum, improving heat transfer by conduction.

According to the present invention there is provided a method for treating a plurality of samples in a vacuum, and for controlling the temperature of the samples, the method comprising, supporting the samples on a support means, and rotating the support means so the samples pass repeatedly through a region at which treatment occurs, the size of the support means being such that the mean thermal power intensity generated by the treatment would, on its own, lead to an equilibrium temperature at or below a desired temperature, detecting the temperature of the samples, and supplying auxiliary heating to the samples in accordance with the difference between the desired temperature and the detected temperature.

Preferably the support means is rotated at such a rate that the temperature of any sample fluctuates by not more than ±10K during a revolution.

The treatment to which the samples are subjected might for example be ion beam irradiation. The auxiliary heating may be supplied by infra-red radiation from a tungsten filament lamp, or from a xenon lamp, or may be supplied by electron beam heating. The auxiliary heating may be supplied to each sample uniformly and substantially continuously throughout each revolution.

Desirably the exposed surfaces of the support means have a similar emissivity for radiant thermal energy to that of the samples, and desirably the support means has a similar thermal time constant to that of the samples.

The present invention also provides an apparatus for treating a plurality of samples in a vacuum and for controlling the temperature of the samples, the apparatus comprising a support means to support the samples in an evacuated enclosure, means to rotate the support means so the samples pass repeatedly through a region at which treatment occurs, the size of the support means being such that the mean thermal power generated by the treatment would, on its own, lead to an equilibrium temperature at or below a desired temperature, means to detect the temperature of the samples, and means to supply auxiliary heating to the samples in accordance with the difference between the desired temperature and the detected temperature.

In the high dose ion implantation of silicon wafers with oxygen or nitrogen ions, for example, it is necessary to use an ion beam current of about 100 mA. The required energy for penetration of the silicon is about 200 keV, and so the beam power is about 20 kW. This energy is dissipated to heat in the wafers, which must then be dissipated to the surrounding if unacceptable wafer temperatures are not to be reached. The preferred wafer temperature to achieve a crystalline silicon layer above the oxide or nitride dielectric layer lies in the range 350° C. to 750° C., and must be controlled to within ±10K during treatment. The invention is thus especially suited for this process.

The invention will now be further described, by way of example only, and with reference to the accompanying drawing which shows a diagrammatic sectional view of an ion beam treatment apparatus.

Referring to the drawing, an ion beam treatment apparatus 10 comprises an evacuatable chamber 12 connected to a vacuum pump system 14 including a titanium sublimation pump. Within the chamber 12 is a 200 keV ion source 16 anad a magnet system 18 arranged to produce a beam B of oxygen ions with an ion current of 100 mA. The ion beam B is arranged to be incident upon the outer surface 20 of a hollow drum 22 of diameter 1 m and of length 0.5 m rotatable about a shaft 24.

Mounted onto the outer surface 20 are a large number of silicon wafers 26, typically between 200 and 300, to be irradiated by the ion beam B, each wafer 26 being mounted so as to lie in a plane perpendicular to the incident io beam B. During operation of the apparatus 10 the drum 22 is rotated on its shaft 24, and the ion beam B is scanned to and fro across the width of the drum 22 by the magnet system 18, so that the whole of the outer surface 20 is irradiated. The drum 22 is of a titanium alloy so as to be relatively light weight and to have a similar thermal inertia to that of the wafers 26, and its outer surface 20 is protected by a surface layer of titanium nitride to improve its wear resistance, to reduce sputtering, and to provide a thermal emissivity similar to that of the wafers 26.

The thermal power of 20 kW generated by the ion beam B is thus spread over an area of 1.6 m$^2$, giving an average intensity of about 1.2 W cm$^{-2}$. The drum 22 and the wafers 26 lose heat principally by radiation, and consequently if no other heat sources were present, would reach an equilibrium temperature of about 400° C. This is at the lower end of the range of acceptable wafer temperatures at which a cyrstalline silicon layer will be produced above the oxide layer created by the ion beam B. The desired wafer temperature may for example be 500° C.

The temperature of the wafers 26 is measured pyrometrically by an infra-red detector 30, which is connected to a microprocessor 32. Around the outside of the drum 22 and spaced apart from it are a number of cylindrical infra-red tungsten filament lamps 34 (eleven are shown) extending parallel to the longitudinal axis of the drum 22, each of maximum power 1 kW, and also connected to the microprocessor 32. An optical sensor 36 is arranged to detect the amount of oxygen implanted into the wafers 26.

During operation of the apparatus 10 the power output of the lamps 34 is controlled by the microprocessor 32 in accordance with the temperature of the wafers 26 as measured by the detector 30, so as to maintain the temperature of the wafers 26 as near to the desired temperature as possible. Furthermore the drum 22 is rotated at such a speed, of the order of 100 rpm, that the wafers 26 fluctuate in temperature by no more than ±10K during a revolution. It will be appreciated that since the heat provided by the lamps 34 is substantially uniform around most of the periphery of the drum 22 whereas the ion implantation occurs only over a small fraction of the path of any wafer 26, any radiation damage will tend to be thermally annealed.

I claim:

1. A method for subjecting a plurality of samples to a heat generating treatment in a vacuum, and for controlling the temperature of the samples, the method comprising, supporting the samples on a support means in an evacuated enclosure, and rotating the support means so the samples pass repeatedly through a region at which the heat generating treatment occurs, the size of the support means being such that the mean thermal power intensity generated by the treatment would, on its own, lead to an equilibrium temperature at or below a predetermined desired temperature, detecting the temperature of the samples, and supplying auxiliary heating to the samples in accordance with the difference between the predetermined desired temperature and the detected temperature.

2. A method as claimed in claim 1 wherein the support means is rotated at such a rate that the temperature of any sample fluctuates by not more than ±10K during a revolution.

3. A method as claimed in claim 1 wherein the auxiliary heating is provided by radiation selected from the group consisting of infra-red and visible radiation.

4. A method as claimed in claim 1 wherein the auxiliary heating is provided by electron beam heating.

5. A method as claimed in claim 1 wherein the auxiliary heating is supplied to each sample uniformly and substantially continuously throughout each revolution.

6. An apparatus for subjecting a plurality of samples to a heat genertaing treatment in a vacuum and for controlling the temperature of the samples, the apparatus comprising a support means to support the samples in an evacuated enclosure, means to rotate the support means so the samples pass repeatedly through a region at which the heat generating treatment occurs, the size of the support means being such that the mean thermal power generated by the treatment would, on its own, lead to an equilibrium temperature at or below a predetermined desired temperature, means to detect the temperature of the samples, and means to supply auxiliary heating to the samples in accordance with the difference between the perdetermined desired temperature and the detected temperature.

7. An apparatus as claimed in claim 6 wherein the auxiliary heating comprises a source of radiation selected from the group consisting of infra-red and visible radiation.

8. An apparatus as claimed in claim 6 wherein the auxiliary heating means comprises an electron beam source.

9. An apparatus as claimed in claim 6 wherein the auxiliary heating means is arranged to supply the auxiliary heating to each sample uniformly and substantially continuously throughout each revolution.

10. An apparatus as claimed in claim 6 wherein the exposed surfaces of the support means have a similar emissivity for radiant thermal energy to that of the samples, and the support means has a similar thermal time constant to that of the samples.

* * * * *